United States Patent [19]
Craft

[11] Patent Number: 5,874,908
[45] Date of Patent: Feb. 23, 1999

[54] METHOD AND APPARATUS FOR ENCODING LEMPEL-ZIV 1 VARIANTS

[75] Inventor: David John Craft, Austin, Tex.

[73] Assignee: International Business Machines Corporation, Armonk, N.Y.

[21] Appl. No.: 934,387

[22] Filed: Sep. 19, 1997

[51] Int. Cl.$^6$ .................................................. H03M 7/00
[52] U.S. Cl. ............................................................. 541/87
[58] Field of Search ........................ 341/87, 51; 370/477, 370/118, 79, 82

[56] References Cited

U.S. PATENT DOCUMENTS

| | | | |
|---|---|---|---|
| 5,016,009 | 5/1991 | Whiting et al. | 341/67 |
| 5,526,363 | 6/1996 | Weiss et al. | 370/118 |
| 5,608,396 | 3/1997 | Cheng et al. | 341/50 |
| 5,612,693 | 3/1997 | Craft et al. | 341/51 |
| 5,627,534 | 5/1997 | Craft et al. | 341/87 |
| 5,652,878 | 7/1997 | Craft et al. | 395/601 |

OTHER PUBLICATIONS

QIC Development Standard, Adaptive Lossless Data Compression (ALDC), QIC–154, Revision A, Mar. 10, 1994.

Jacob Ziv and Abraham Lempel, A Universal Algorithm for Sequential Data Compression, IEEE Transactions on Information Theory, vol. IT–23, No. 3, May 1977.

James A. Storer and Thomas G. Szymanski, Data Compression via Textual Substitution, Journal of the Association for Computing Machinery, vol. 29, No. 4, Oct. 1982, pp. 928–951.

Timothy C. Bell, Better OPM/L Text Compression, IEEE Transactions on Communications, vol. Com–34, No. 12, Dec. 1986.

*Primary Examiner*—Brian Young
*Attorney, Agent, or Firm*—Casimer K. Salys; Antony P. Ng; Andrew J. Dillon

[57] ABSTRACT

A method for encoding an input data stream of source symbols to produce an output sequence of pointers is disclosed. A LITERAL string in an input data stream is first loaded into a history-buffer. A value of a history-buffer pointer is copied to a register to indicate a starting position of the LITERAL string within the history-buffer. A counter is incremented for each subsequent LITERAL symbol from the input data stream. Then, the LITERAL string and each subsequent LITERAL symbol from the input data stream is encoded utilizing a value within the register and a value within the counter as a LITERAL_POINTER. Finally, the LITERAL_POINTER is outputted from a data compressor.

12 Claims, 3 Drawing Sheets

LITERAL_DATA ⟶ if (L_CTR value is 0) go to (1), else go to (2);

/* new match started */ (1) set W_PTR value to L_PTR;
/* but ended after 1 */
/* byte only, so the */ if (C_CTR = 1) amend W_PTR to previous value;
/* PRECEDING byte is */
/* the start of this */ set L_CTR = 1; done;
/* LITERAL_DATA */

(2) Increment L_CTR;

if (L_CTR = maximum) go to (3);

else done;

(3) encode, output maximum L_CTR value; go to (4);

(4) get byte from history, using L_PTR as an index;

output data byte; increment L_PTR by 1;

/* wraparound at end */ if (L_PTR = HISTORY_SIZE) L_PTR = 0;

/* the MAXIMUM L_CTR */ decrement L_CTR by 1;
/* value sets output */
/* length limit, one */ if (L_CTR > 1) go to (4); else done;
/* data byte is left */

COPY_POINTER ⟶ encode, output L_CTR value;

if (L_CTR > 0) go to (5); else go to (6);

(5) get byte from history, using L_PTR as an index;

output data byte; increment L_PTR by 1;

/* wraparound at end */ if (L_PTR = HISTORY_SIZE) L_PTR = 0;

/* now output ALL of */ decrement L_CTR by 1;
/* the data bytes as */
/* counted by L_CTR */ if (L_CTR > 0) go to (5); else go to (6);

(6) encode COPY_POINTER;

done.

*Fig. 2*

METHOD AND APPARATUS FOR ENCODING LEMPEL-ZIV 1 VARIANTS

RELATED CO-PENDING APPLICATION

This application relates to copending application U.S. Ser. No. 08/934,234 filed Sep. 19, 1997, entitled "METHOD AND APPARATUS FOR PERFORMING ADAPTIVE DATA COMPRESSION" (IBM Docket No. AT9-97-723), the subject matter of which is incorporated herein by reference.

BACKGROUND OF THE INVENTION

1. Technical Field

The present invention relates to a method and apparatus for compressing data in general, and in particular to a method and apparatus for performing adaptive data compression. Still more particularly, the present invention relates to a method and apparatus for encoding Lempel-Ziv 1 variants.

2. Description of the Prior Art

The volume of digital data utilized to represent information in computers and workstations, as well as the speed with which these data must be compressed and decompressed in the course of storage or transmission has motivated significant interest in technologies related to data compression. A data compression algorithm that has proven to be quite popular was first described in an article entitled "A Universal Algorithm for Sequential Data Compression" by J. Ziv and A. Lempel, as appeared in IEEE Transactions on Information Theory, vol. IT-23, no. 3, pp. 337–343, 1977. This data compression algorithm is generally referred to as the LZ_1 algorithm. The original LZ_1 algorithm has since been refined in various aspects by numerous investigators. Examples of these so-called LZ_1 variants can be found in U.S. Pat. No. 5,003,307 and U.S. Pat. No. 5,146,221, the subject matter of which is incorporated by reference herein.

Other examples of Lempel-Ziv 1 variants include Adaptive Lossless Data Compression (ALDC) that is widely utilized for general purpose data compression within computers and associated peripheral devices. ALDC is described in full detail in "QIC Development Standard QIC-154," Rev. A, 10 Mar. 1994, Quarter-Inch Cartridge Drive Standards, Inc., the subject matter of which is also incorporated by reference herein.

The fundamental concepts that characterize these and other LZ_1 variants involve the usage of a history-buffer to store new data and to identify new strings of data that match any previously received and processed data. Thereby, new strings of data, typically alphanumeric characters, which match existing strings can be identified by merely referring to an offset (or displacement) and a length in an earlier point of the string sequence within the history-buffer. The LZ_1 algorithm is adaptive because each new data byte is entered into the history-buffer in sequence, and displaces the oldest stored byte if the history-buffer is full. The size of the history-buffer is thus analogous to a sliding window over a data stream in which the new data characters are always compared to previously received characters within the length of the window. The encoded output is a mixture of LITERAL_DATA, where no compression is possible, or COPY_POINTERs, providing a length and offset identifying a matching previously existing character string within the window. As would be expected, the algorithm is increasingly effective as the size of the window increases and repetition of the patterns in the data characters within the window increases.

The present disclosure describes an improved method and apparatus for encoding these Lempel-Ziv 1 variants.

SUMMARY OF THE INVENTION

In view of the foregoing, it is therefore an object of the present invention to provide an improved method and apparatus for compressing data.

It is another object of the present invention to provide an improved method and apparatus for performing adaptive data compression.

It is yet another object of the present invention to provide an improved method and apparatus for encoding the output of a Lempel-Ziv 1 class compression algorithm.

In accordance with a method of the present invention, a LITERAL string in an input data stream is loaded into a history-buffer. A value of a history-buffer pointer is copied to a register to indicate a starting position of the LITERAL string within the history-buffer. A counter is incremented for each subsequent LITERAL symbol from the input data stream. Then, the LITERAL string and each subsequent LITERAL symbol from the input data stream is encoded utilizing a value within the register and a value within the counter as a LITERAL_POINTER. Finally, the LITERAL_POINTER is outputted from a data compressor.

All objects, features, and advantages of the present invention will become apparent in the following detailed written description.

BRIEF DESCRIPTION OF THE DRAWINGS

The invention itself, as well as a eferred mode of use, further objects, and advantages thereof, will best be understood by reference to the following detailed description of an illustrative embodiment when read in conjunction with the accompanying drawings, wherein:

FIG. 1b is a block diagram of a data decompressor unit in which a preferred embodiment of the present invention may be incorporated; and FIG. 2 is a high-level pseudo-code of an encoding scheme for a LITERAL_DATA string, in accordance with a preferred embodiment of the present invention.

DETAILED DESCRIPTION OF A PREFERRED EMBODIMENT

The present invention may be implemented within a data compressor and data decompressor. It is understood by those skilled in the art that the present invention can be implemented in either hardware or software.

I. ENCODER AND DECODER

Figure 1A:
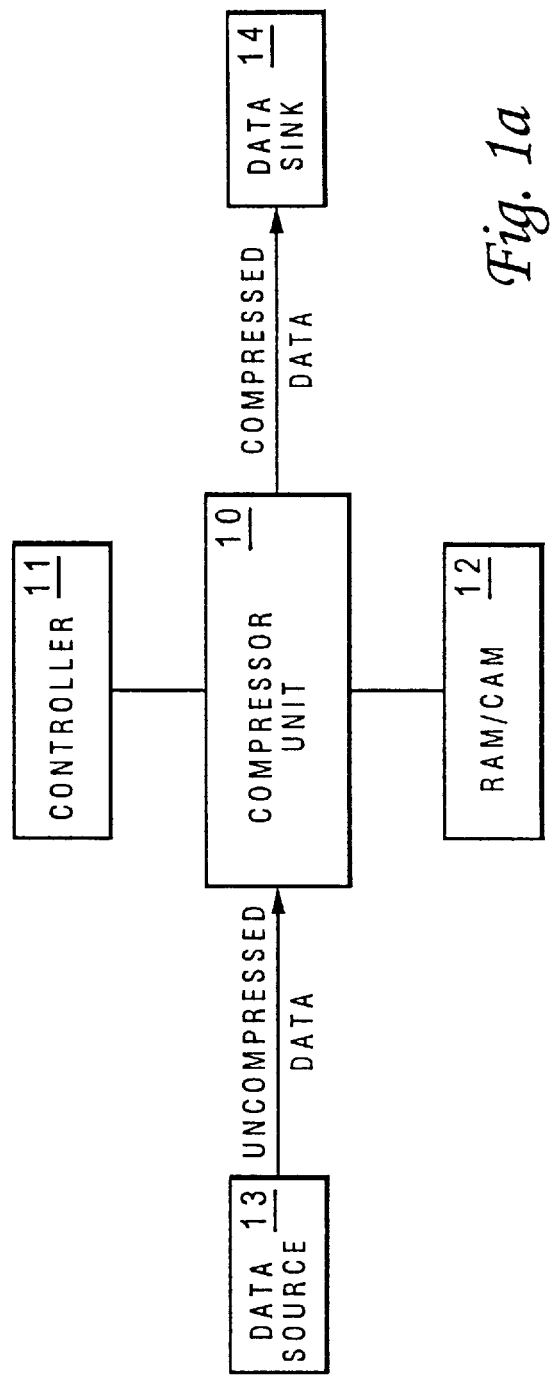
FIG. 1a is a block diagram of a compressor unit in which a preferred embodiment of the present invention may be incorporated.
Figure 16:
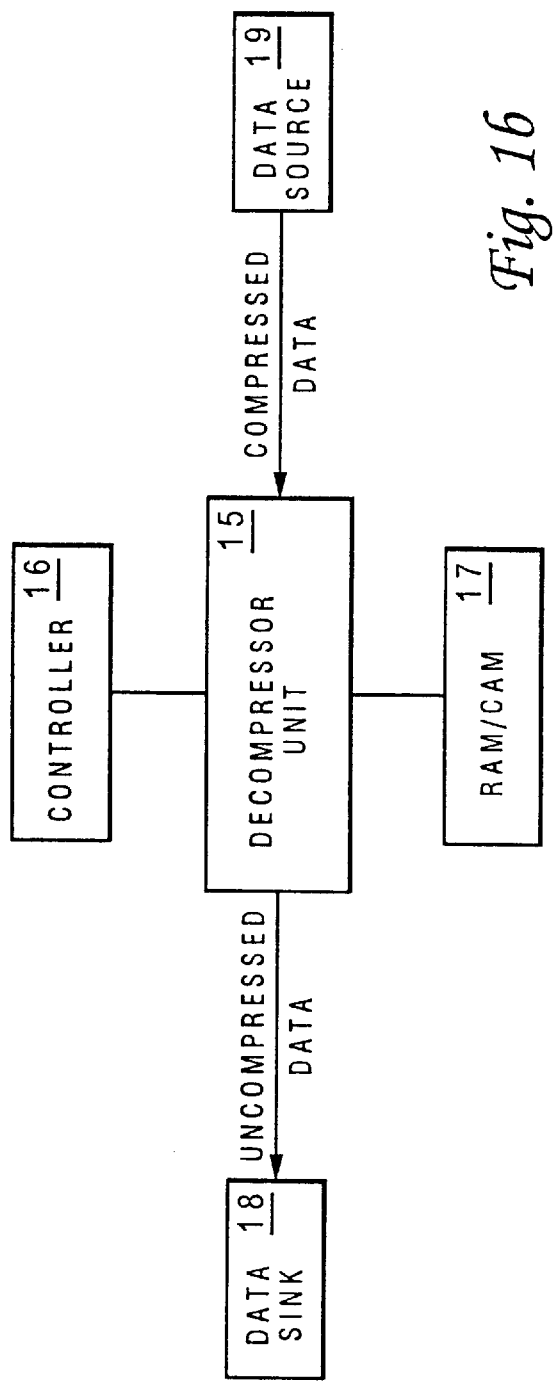

Referring now to the drawings and in particular to FIG. 1a, there is depicted a block diagram of a data compressor unit in which a preferred embodiment of the present invention may be incorporated. As shown, compressor unit 10 is coupled to a controller 11 and a random-access memory (RAM) or content-addressable memory (CAM) 12. All data structures associated with the compression algorithm, such as a history-buffer, are maintained within RAM/CAM 12. As such, the optimal size of RAM/CAM 12 largely depends on the size of the history-buffer. During operation, an uncompressed data stream is first received by compressor unit 10 from a data source 13. After data-encoding, compressed data stream is then transmitted to a data sink 14.

Compressor unit 10 processes the uncompressed data stream one data byte at a time. Each processed data byte is also sequentially copied into a history-buffer, displacing the oldest data byte if the history-buffer is already full. Thus, a sequential copy of the most recent data byte is always available in the history-buffer.

The compression process includes an examination of the incoming data stream to identify any sequence or string of data bytes that already exist within the history-buffer. If an identical string of data bytes is available within the history-buffer, this matching string of data bytes can be encoded as a two-element COPY_POINTER, containing a byte count and a displacement within the history-buffer. Thus, when the string of data bytes can be encoded by a COPY_POINTER in fewer bits of information than normally required, a compression is achieved. However, if an incoming data byte does not match with any data byte within the history-buffer, this incoming data byte will be encoded as a LITERAL that explicitly represents the data byte.

Referring now to FIG. 1b, there is depicted a block diagram of a data decompressor unit in which a preferred embodiment of the present invention may be incorporated. As shown, decompressor unit 15 is coupled to a controller 16 and a RAM/CAM 17. Similar to RAM/CAM 12, all data structures for decompressor unit 15 are maintained within RAM/CAM 17. During operation, a compressed data stream is first received by decompressor unit 15 from data source 19. After data-decoding, uncompressed data stream will then be transmitted from decompressor unit 15 to a data sink 18. Decompressor unit 15 performs an inverse operation of compressor unit 10 by first parsing a compressed data stream into LITERALs and COPY_POINTERs.

On the other hand, a COPY_POINTER is processed by first decoding the specified byte count and the displacement of the COPY_POINTER. Subsequently, this string of data byte values is read, one byte at a time, from the history-buffer within decompressor unit 15. Each data byte value is then copied into the history-buffer and output as decoded data byte, before the next data byte value is accessed. Once the entire string of data bytes has been processed in this manner, the history-buffer within decompressor unit 15 will be identical to the history-buffer within compressor unit 10.

II. ENCODING SCHEME

As a preferred embodiment of the present invention, the history-buffer within compressor unit 10 is also utilized as a buffer for LITERAL_DATA. In the classical LZ_1 algorithm, data is processed one symbol (or usually one byte, in the case of most LZ_1 variants) at a time. Each processed symbol is stored into the history-buffer before the next symbol is examined. With a high-speed Content-Addressable Memory (CAM) based implementation, the CAM can be arranged to perform a search and write on each incoming data byte. The incoming data byte symbol is then written into the CAM, at the current history-buffer update location, as well as testing either for the start of a new matching string, or for continuation of an existing string matching operation. As each non-matching string symbol is encountered, which is also not the start of a new matching string, it is accumulated to a LITERAL_DATA string which will be encoded and output later.

The LITERAL_DATA is retained in a buffer, and when the upper limit of whatever count code utilized is reached, or if there is a string match on the incoming data such that a COPY_POINTER must next be utilized, a new kind of LITERAL_POINTER is output, consisting of a SYMBOL_COUNT code, followed by the LITERAL_DATA string, which empties this buffer.

Because the present invention utilizes the history-buffer itself as a buffer for the LITERAL_DATA, the SYMBOL_COUNT code can be extended to allow up to an entire history-buffer size of LITERAL_DATA to be accumulated, and there is no hardware penalty because of the need to provide such a large separate buffer.

The SYMBOL_COUNT code field may be a fixed-length field, for example, a 2-bit field, which has the effect of reducing the worst-case data expansion by about ⅔, or to about 8% maximum. As an alternative, the COPY_POINTER count field can be of variable-length, and might, for example, utilize the same variable-length code as is utilized for COPY_POINTER length encoding in the ALDC algorithm. In this implementation, the same 2-bit length is utilized for small values, but may be increased to 12 bits for a value up to 269. This reduces LITERAL_DATA expansion to approximately 0.6%.

When the first symbol of a LITERAL_DATA string is processed, a register is loaded with the current history-buffer location value. A counter, which is utilized to keep track the number of consecutive LITERAL_DATA symbols, is then set to 1. The accumulation of the LITERAL_DATA continues, symbol by symbol, and is terminated either by the start of a new matching string, or when the LITERAL_DATA becomes sufficiently long that it is going to wrap around and overwrite the starting point in the history-buffer. The accumulation process only requires that this counter be incremented by 1 for each additional LITERAL_DATA symbol, once the history-buffer location address has been captured.

Once termination of the LITERAL_DATA string occurs, the compressor first encodes and outputs the SYMBOL_COUNT value, followed by copying from the history-buffer a number of symbols equal to the SYMBOL_COUNT, starting from the history-buffer location address already recorded. This is the required LITERAL_DATA string.

The optimal code choice for the SYMBOL_COUNT depends on the size of the history-buffer and the data statistics, but an example code is given in Table I, for a 1024 symbol history-buffer size.

TABLE I

| SYMBOL_ COUNT CODE | VALUE |
| --- | --- |
| 0 0 | 0 |
| 0 1 | 1 |
| 10 00 | 2 |
| 10 01 | 3 |
| 10 10 | 4 |
| 10 11 | 5 |
| 11 0000000000 | 6 |
| ... ........... | . |
| ... ........... | . |
| ... ........... | . |
| 11 1111111001 | 1023 |
| 11 1111111010 | 1024[1] |
| 11 1111111011 | 1025[2] |
| ... ........... | .... |
| ... ........... | .... |
| ... ........... | .... |
| 11  111111111 | 1029 |

Remarks:
[1]ESCAPE CODE: 1023 bytes of LITERAL_DATA, then, another SYMBOL_COUNT
[2]residual code values: 1025 through 1029 are reserved, and thus not used.

For small strings of a few bytes of literal data, the shorter 2 or 4 bit codes give similar expansion to existing LZ-1 algorithms; however, for very large LITERAL_DATA strings the 12-bit code gives an expansion of only (1023+ 1.5)/1023, or about 0.15%, since a 1.5 byte SYMBOL_COUNT must be inserted every 1023 bytes. Although there are pathological cases where the LITERAL_DATA strings are encoded less efficiently, these LITERAL_DATA strings are separated by a COPY_POINTER, which always supplies some compression.

As an example, consider the worst case of 2 byte LITERAL_DATA strings alternated with 2 byte COPY_POINTERs, the latter encoded utilizing the ALDC format. The encoding here is a 4-bit SYMBOL_COUNT, a 16-bit LITERAL_DATA field, then a 12-bit COPY_POINTER containing a 2-bit count field and 10-bit displacement (no flag bits). The total here is 32 bits to encode 4 bytes, so there is no expansion.

III. IMPLEMENTATIONS

With reference now to FIG. 2, there is illustrated a high-level pseudo-code of an encoding scheme for a LITERAL_DATA string, in accordance with a preferred embodiment of the present invention. In this implementation, for example, a Literal_Data Counter (L_CTR), a Literal_Pointer Register (L_PTR), Copy_Pointer Counter (C_CTR), and a History Write_Pointer Register (W_PTR) are utilized. Note that the Copy_Pointer Counter and the History Write_Pointer Register will typically be utilized by the compressor anyway; hence, in most cases, only the addition of Literal_Data Counter and the Literal_Pointer Register are required.

As a preferred embodiment of the present invention, the Compressor operation is as follows. The W_PTR is incremented after the input of a data byte. If the W_PTR equals to the size of the history-buffer, the W_PTR value is set to zero. Subsequently, the data byte is stored into the history-buffer, utilizing the W_PTR as an index into the history-buffer. A determination is then made as to whether the input data byte is a LITERAL, start of new match, or end of existing match (either with or without a start of a possible new match). Finally, a LITERAL_DATA or COPY_POINTER is inserted as appropriate, and the next byte is input.

For a LITERAL_DATA, if the L_CTR value is equal to 0, then go to step (1), else go to step (2). In step (1), the W_PTR value is set to L_PTR; if C_CTR is equal to 1, then W_PTR is amended to the previous value, and the L_CTR is set to 1.

In step (2), the L_CTR is incremented; if the L_CTR is equal to MAXIMUM, then go to step (3), otherwise, the encoding is completed. In step (3), perform encoding and output the MAXIMUM L_CTR value, then go to step (4).

In step (4), a data byte is obtained from the history-buffer, utilizing the L_PTR as an index to the history-buffer. The data byte is then outputted, and the L_PTR is incremented by 1. If the L_PTR is equal to the HISTORY_SIZE, then set the L_PTR to 0, then the L_CTR is decremented by 1. If the L_CTR is greater than 1, go to step (4); otherwise the coding is done.

For a COPY_POINTER, perform encoding and output the L_CTR value. IF the L_CTR is greater than 0, then go to step (5), otherwise go to step (6). In step (5), a data byte is obtained from the history-buffer, utilizing the L_PTR as an index to the history-buffer. Then, the data byte is output, and the L_PTR is incremented by 1. If the L_PTR is equal to the HISTORY_SIZE, then set the L_PTR to 0 and decrement the L_CTR by 1. If the L_CTR is greater than 0, then go to step (5), otherwise go to step (6).

In step (6), the COPY_POINTER is encoded, and the encoding process is complete.

As has been described, the present invention provides an improved method and apparatus for performing adaptive data compression efficiently within a compressor unit. Under the present invention, the worst-case data expansion which occurs when the output consist of largely LITERAL_DATA can be significantly reduced.

In addition, with the coding scheme as described, the inherent expansion for random or uncompressible data can be reduced by eliminating the usage of the flag bits to distingush LITERAL_DATA and COPY_POINTERs. In addition, hardware costs are reduced by utilizing the history-buffer to provide the necessary buffering at no extra cost. A decompressor under this coding scheme does not require any additional buffering.

It is also important to note that although the present invention has been described in the context of a hardware compressor, those skilled in the art will appreciate that the mechanisms of the present invention can be implemented in software and be distributed as a program product in a variety of forms, and that the present invention applies equally regardless of the particular type of signal bearing media utilized to actually carry out the distribution. Examples of signal bearing media include but are not limited to recordable type media such as floppy disks or CD ROMs, and transmission type media such as analog or digital communications links.

While the invention has been particularly shown and described with reference to a preferred embodiment, it will be understood by those skilled in the art that various changes in form and detail may be made therein without departing from the spirit and scope of the invention.

What is claimed is:

1. A method for encoding an input data stream of source symbols to produce an output sequence of pointers by utilizing a history-buffer within a data compressor, said method comprising the steps of:

loading a LITERAL string in said input data stream to said history-buffer;

copying a value of a history-buffer pointer to a register to indicate a starting position of a LITERAL string within said history-buffer;

incrementing a counter for each subsequent LITERAL symbol from said input data stream;

encoding said LITERAL string and each said subsequent LITERAL symbol from said input data stream utilizing a value within said register and a value within said counter as a LITERAL_POINTER; and outputting said LITERAL_POINTER from said data compressor.

2. The method for encoding an input data stream of source symbols according to claim 1, wherein said LITERAL_POINTER includes a SYMBOL_COUNT code followed by a corresponding number of LITERAL_DATA symbols.

3. The method for encoding an input data stream of source symbols according to claim 1, wherein said SYMBOL_COUNT can be of fixed length or variable length.

4. The method for encoding an input data stream of source symbols according to claim 1, wherein said counter can count up to the size of said history-buffer.

5. A data compressor for encoding an input data stream of source symbols to produce an output sequence of pointers by utilizing a history-buffer, said data compressor comprising:

means for loading a LITERAL string in said input data stream to said history-buffer;

means for copying a value of a history-buffer pointer to a register to indicate a starting position of a LITERAL string within said history-buffer;

means for incrementing a counter for each subsequent LITERAL symbol from said input data stream;

means for encoding said LITERAL string and each said subsequent LITERAL symbol from said input data stream utilizing a value within said register and a value within said counter as a LITERAL_POINTER; and means for outputting said LITERAL_POINTER from said data compressor.

6. The data compressor according to claim 5, wherein said LITERAL_POINTER includes a SYMBOL_COUNT code followed by a corresponding number of LITERAL_DATA symbols.

7. The data compressor according to claim 5, wherein said SYMBOL_COUNT can be of fixed length or variable length.

8. The data compressor according to claim 5, wherein said counter can count up to the size of said history-buffer.

9. A program software product for encoding an input data stream of source symbols to produce an output sequence of pointers by utilizing a history-buffer, said program software product comprising:

program code means for loading a LITERAL string in said input data stream to said history-buffer;

program code means for copying a value of a history-buffer pointer to a register to indicate a starting position of a LITERAL string within said history-buffer;

program code means for incrementing a counter for each subsequent LITERAL symbol from said input data stream;

program code means for encoding said LITERAL string and each said subsequent LITERAL symbol from said input data stream utilizing a value within said register and a value within said counter as a LITERAL_POINTER; and program code means for outputting said LITERAL_POINTER from said data compressor.

10. The program software product for encoding an input data stream of source symbols to produce an output sequence of pointers according to claim 9, wherein said LITERAL_POINTER includes a SYMBOL_COUNT code followed by a corresponding number of LITERAL_DATA symbols.

11. The program software product for encoding an input data stream of source symbols to produce an output sequence of pointers according to claim 9, wherein said SYMBOL_COUNT can be of fixed length or variable length.

12. The program software product for encoding an input data stream of source symbols to produce an output sequence of pointers according to claim 9, wherein said counter can count up to the size of said history-buffer.

* * * * *

UNITED STATES PATENT AND TRADEMARK OFFICE
CERTIFICATE OF CORRECTION

PATENT NO.   : 5,874,908
DATED        : Feb. 23, 1999
INVENTOR(S)  : *Craft*

It is certified that error appears in the above-identified patent and that said Letters Patent is hereby corrected as shown below:

In col. 2, line 31, please change "eferred" to -- preferred --.

In col. 4, please delete "TABLE I" and substitute the following:

TABLE I

| SYMBOL_COUNT CODE | VALUE |
|---|---|
| 0 0 | 0 |
| 0 1 | 1 |
| 10 00 | 2 |
| 10 01 | 3 |
| 10 10 | 4 |
| 10 11 | 5 |
| 11 0000000000 | 6 |
| ⋮ | ⋮ |
| 11 1111111001 | 1023 |
| 11 1111111010 | 1024[1] |
| 11 1111111011 | 1025[2] |
| ⋮ | ⋮ |
| 11 1111111111 | 1029 |

Signed and Sealed this

Twenty-second Day of May, 2001

Attest:

NICHOLAS P. GODICI

*Attesting Officer*  *Acting Director of the United States Patent and Trademark Office*